US010164076B2

(12) United States Patent
Chuang et al.

(10) Patent No.: US 10,164,076 B2
(45) Date of Patent: Dec. 25, 2018

(54) VERTICAL TUNNELING FIELD-EFFECT TRANSISTOR CELL AND FABRICATING THE SAME

(71) Applicant: Taiwan Semiconductor Manufacturing Co., Ltd., Hsin-Chu (TW)

(72) Inventors: Harry-Hak-Lay Chuang, Singapore (SG); Cheng-Cheng Kuo, Hsinchu (TW); Chi-Wen Liu, Hsinchu (TW); Ming Zhu, Singapore (SG)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1 day.

(21) Appl. No.: 15/392,579

(22) Filed: Dec. 28, 2016

(65) Prior Publication Data
US 2017/0110559 A1 Apr. 20, 2017

Related U.S. Application Data

(63) Continuation of application No. 13/745,579, filed on Jan. 18, 2013, now Pat. No. 9,536,977.

(51) Int. Cl.
*H01L 29/66* (2006.01)
*H01L 21/336* (2006.01)
(Continued)

(52) U.S. Cl.
CPC .. *H01L 29/66977* (2013.01); *H01L 21/26513* (2013.01); *H01L 21/308* (2013.01);
(Continued)

(58) Field of Classification Search
CPC .......... H01L 29/7827; H01L 29/66666; H01L 29/7391; H01L 29/66356; H01L 29/78642
(Continued)

(56) References Cited

U.S. PATENT DOCUMENTS 8,754,470 B1 6/2014 Chuang et al.
9,190,484 B2 11/2015 Chuang et al.
(Continued)

OTHER PUBLICATIONS

Taiwanese Application No. 102144549, Office Action dated May 12, 2015.
(Continued)

*Primary Examiner* — Fernando L Toledo
*Assistant Examiner* — Aaron J Gray
(74) *Attorney, Agent, or Firm* — Haynes and Boone, LLP

(57) ABSTRACT

A method for forming a tunneling field-effect transistor (TFET) is disclosed. The method includes etching a semiconductor substrate to form a semiconductor protrusion that protrudes out from a top surface of the semiconductor substrate, forming a drain region in lower portion of the semiconductor protrusion, and patterning a gate stack layer to form a gate stack. The gate stack has a gating surface that directly contacts and wraps around a middle portion of the semiconductor protrusion. The method further includes forming a source region in an upper portion of the semiconductor protrusion and forming a source contact over the source region, the source contact have a first width that is larger than a width of the source region.

20 Claims, 5 Drawing Sheets

(51) Int. Cl.
*H01L 21/332* (2006.01)
*H01L 21/8238* (2006.01)
*H01L 29/739* (2006.01)
*H01L 21/265* (2006.01)
*H01L 21/3065* (2006.01)
*H01L 21/308* (2006.01)
*H01L 21/324* (2006.01)
*H01L 29/06* (2006.01)
*H01L 29/423* (2006.01)
*H01L 29/786* (2006.01)

(52) U.S. Cl.
CPC ........ *H01L 21/3065* (2013.01); *H01L 21/324* (2013.01); *H01L 29/0653* (2013.01); *H01L 29/42392* (2013.01); *H01L 29/66356* (2013.01); *H01L 29/66666* (2013.01); *H01L 29/66742* (2013.01); *H01L 29/7391* (2013.01); *H01L 29/78618* (2013.01); *H01L 29/78642* (2013.01); *H01L 29/0657* (2013.01)

(58) Field of Classification Search
USPC ....... 257/329, 24, 25, E21.41; 438/268, 212, 438/138, 156
See application file for complete search history.

(56) References Cited

U.S. PATENT DOCUMENTS

| | | |
|---|---|---|
| 2008/0308908 A1 | 12/2008 | Otake |
| 2010/0210079 A1* | 8/2010 | Masuoka .......... H01L 29/42392 438/156 |
| 2011/0115011 A1* | 5/2011 | Masuoka ........ H01L 21/823431 257/314 |
| 2011/0253981 A1* | 10/2011 | Rooyackers ........... B82Y 10/00 257/24 |
| 2011/0303973 A1 | 12/2011 | Masuoka et al. |
| 2014/0042524 A1 | 2/2014 | Chuang et al. |

OTHER PUBLICATIONS

Zhao, Han, et al. $In_{0.7}Ga_{0.3}As$ Tunneling Field-Effect Transistors with an $I_{on}$ of 50 µA / βm and a Subthreshold Swing of 86 mV/dec using $HfO_2$ Gate Oxide, IEEE Electron Device Letters, vol. 31, No. 12, Dec. 2010, pp. 1392-1394.

* cited by examiner

VERTICAL TUNNELING FIELD-EFFECT TRANSISTOR CELL AND FABRICATING THE SAME

PRIORITY

The present application is a continuation application of U.S. application Ser. No. 13/745,579, filed Jan. 18, 2013, entitled "Vertical Tunneling Field-Effect Transistor Cell and Fabricating the Same," which is herein incorporated by reference in its entirety.

CROSS-REFERENCE

This patent is related to the following patents, the disclosures of which are hereby incorporated by reference:
- A Vertical Tunneling Field-Effect Transistor Cell And Fabricating The Same, Ser. No. 13/745,225 filed Jan. 18, 2013;
- A Vertical Tunneling Field-Effect Transistor Cell And Fabricating The Same, Ser. No. 13/745,459 filed Jan. 18, 2013.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous challenges have risen. As features become closer, current leakage can become more noticeable, signals can crossover more easily, and power usage has become a significant concern. The semiconductor integrated circuit industry has produced numerous developments in effort to continue the process of scaling. One of the developments is the potential replacement or supplementation of the conventional MOS field-effect transistor by the tunneling field-effect transistor (TFET).

Tunneling FETs are promising devices that may enable further scaling of power supply voltage without substantially increasing off-state leakage currents due to its sub-60 mV/dec subthreshold swing. However, existing TFETs have not been satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
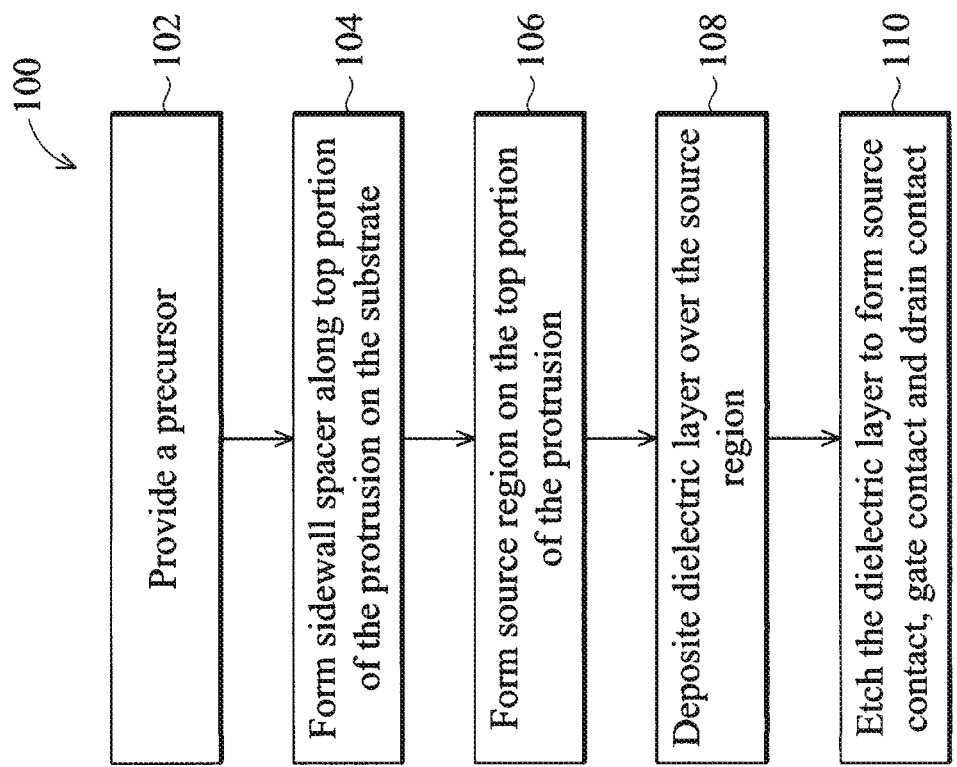
FIG. 1 is a flowchart of an example method for fabricating a semiconductor device constructed according to various aspects of the present disclosure.

FIG. 1 is a flowchart of one embodiment of a method 100 of fabricating one or more TFET devices according to aspects of the present disclosure. The method 100 is discussed in detail below, with reference to a TFET device precursor 200 and the TFET device 600 shown in FIGS. 2 to 5 for the sake of example.

Figure 2:
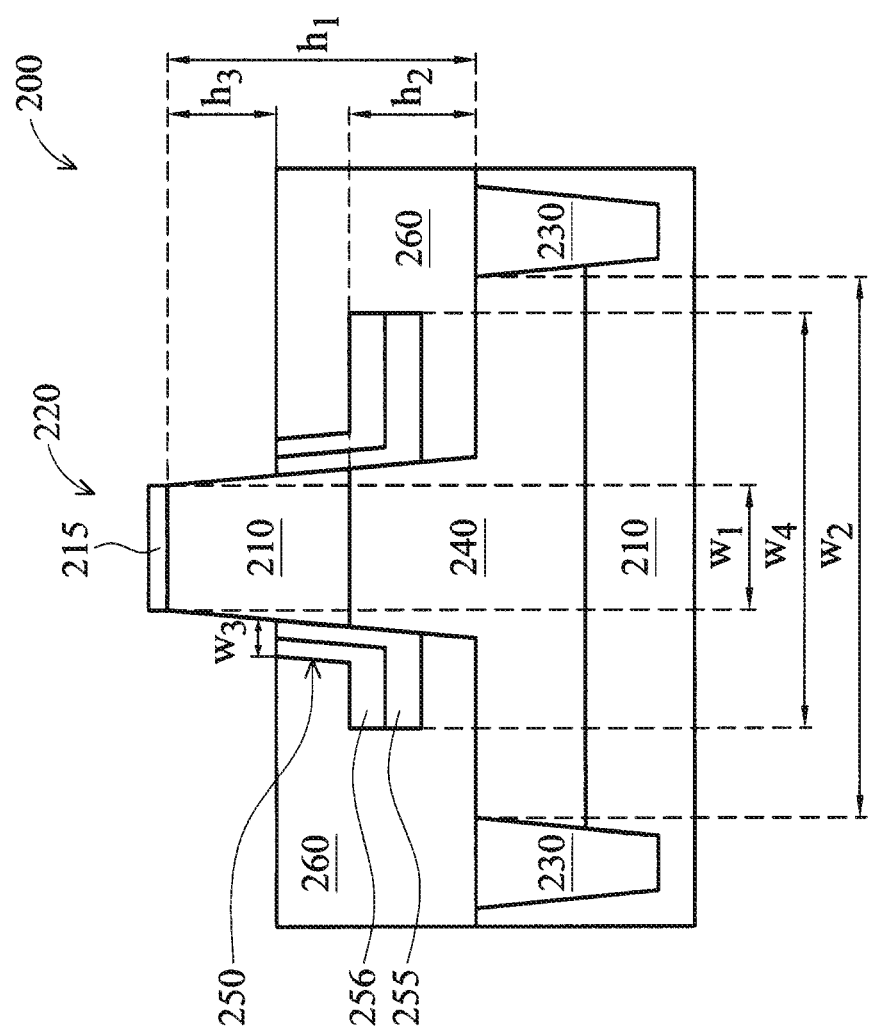
FIG. 2 is a cross-section view of an example precursor at the fabrication stages constructed according to the method of FIG. 1.

Referring to FIGS. 1 and 2, the method 100 begins at step 102 by providing a precursor 200 of the TFET device 600. The precursor 200 includes a substrate 210. The substrate 210 includes silicon. In alternative embodiments, the substrate 210 may include germanium, silicon germanium, gallium arsenide, silicon carbide, indium arsenide, indium phosphide, gallium arsenic phosphide, gallium indium, or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials. The substrate 210 may also include various p-type doped regions and/or n-type doped regions, implemented by a process such as ion implantation and/or diffusion. Those doped regions include n-well and p-well.

The precursor 200 also includes a frustoconical protrusion structure 220 with a first width $w_1$, which protrudes out of the plane of substrate 210 with a first height $h_1$. The frustoconical protrusion structure 220 is referred as a core structure. The core structure 220 may be formed by lithography and etching processes. In one embodiment, a hard mask layer 215 is deposited on the substrate 210 first. The hard mask 215 includes silicon oxide, silicon nitride, silicon oxynitride, or any other suitable dielectric material. The hard mask 215 may be patterned by lithography and etching processes to define the core structure 220 with the first width $w_1$. Then the substrate 210 is etched by using the patterned hard mask 215 as an etching mask to form the core structure 220. The etch process may include wet etch, dry etch, or a combination thereof. The core structure 220 may be formed with sidewalls having an angle α with the planar surface of the substrate 210 ranging from approximately 45 degrees to around 90 degrees.

In one embodiment, the core structure 220 is formed as a cylinder shape. Alternatively, the core structure 220 is formed as square-column, oval cylinder, rectangular column, hexagonal column, or other polygon-column shape.

The precursor 200 also includes isolation features 230 formed on the substrate 210, including between each core structure 220. The isolation features 230 include different structures formed by using different processing technologies. In one embodiment, the isolation features 230 are shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench.

The precursor 200 also includes a drain region 240 with a second width $w_2$ on the substrate 210. The second width $w_2$ is substantially larger than the first width $w_1$. In one embodiment, the drain region 240 is concentric with the core structure 220. The drain region 240 may be formed by doping and annealing. In the present embodiment, the drain region 240 is formed such that it is adjacent to the core structure 220 and extends to a bottom portion of the core structure 220 with a second height of $h_2$, referred as to a raised drain region 240. For a p-type TFET, the drain region 240 may be doped with p-type dopants, such as boron or $BF_2$. For an n-type TFET, the drain region 240 may be doped with n-type dopants, such as phosphorus, arsenic, or a combination thereof.

The precursor 200 also includes a gate stack 250. The gate stack 250 includes a planar portion, which is parallel to the surface of substrate 210, and a gating surface, which wraps around a middle portion of the core structure 220. The planar portion may be asymmetric to the core structure 220. In the present embodiment, a top portion with a third height $h_3$ of the core structure 220 is not wrapped by the gating surface. In one embodiment, the out-of-plane gating surface of gate stack 250 overlaps a portion of the raised drain region 240. The gating surface has a third width $w_3$ and the gate stack 250 has a total width, a forth width $w_4$. The $w_4$ is substantially larger than the first width $w_1$ of the core structure 220 and less than the second width $w_2$ of the drain region 240.

The gate stack 250 may be formed by a procedure including depositing, photolithography patterning and etching processes. The deposition processes include chemical vapor deposition (CVD), atomic layer deposition (ALD), physical vapor deposition (PVD), metalorganic CVD (MOCVD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching process includes a dry etch, a wet etch, or a combination thereof.

In one embodiment, the gate stack 250 is a high-k (HK)/metal gate (MG). The HK/MG includes a gate dielectric layer 255 and a MG 256. The gate dielectric layer 255 may include an interfacial layer (IL) and a high-k (HK) dielectric layer. The IL includes oxide, HfSiO and oxynitride. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), or other suitable materials. The MG 256 may include a single layer or multi layers, such as a metal layer, a liner layer, a wetting layer, and an adhesion layer. The MG 256 may include Ti, Ag, Al, TiAlN, TaC, TaCN, TaSiN, Mn, Zr, TiN, TaN, Ru, Mo, Al, WN, Cu, W, or any suitable materials.

In another embodiment, the gate stack 250 is a polysilicon gate stack. The polisilicon gate stack may include a gate dielectric layer and a polysilicon layer deposited over the gate dielectric layer. The gate dielectric layer includes silicon oxide, silicon nitride, or any other suitable materials.

The precursor 200 also includes an isolation dielectric layer 260 disposed on the substrate 210, including between the planar portion of the gate stack 250 and the drain region 240. The isolation dielectric layer 260 includes silicon oxide, silicon nitride, silicon carbide, oxynitride or other suitable materials. The isolation dielectric layer 260 includes multiple layers. The isolation dielectric layer 260 may be formed by deposition and recess processes.

Figure 3:
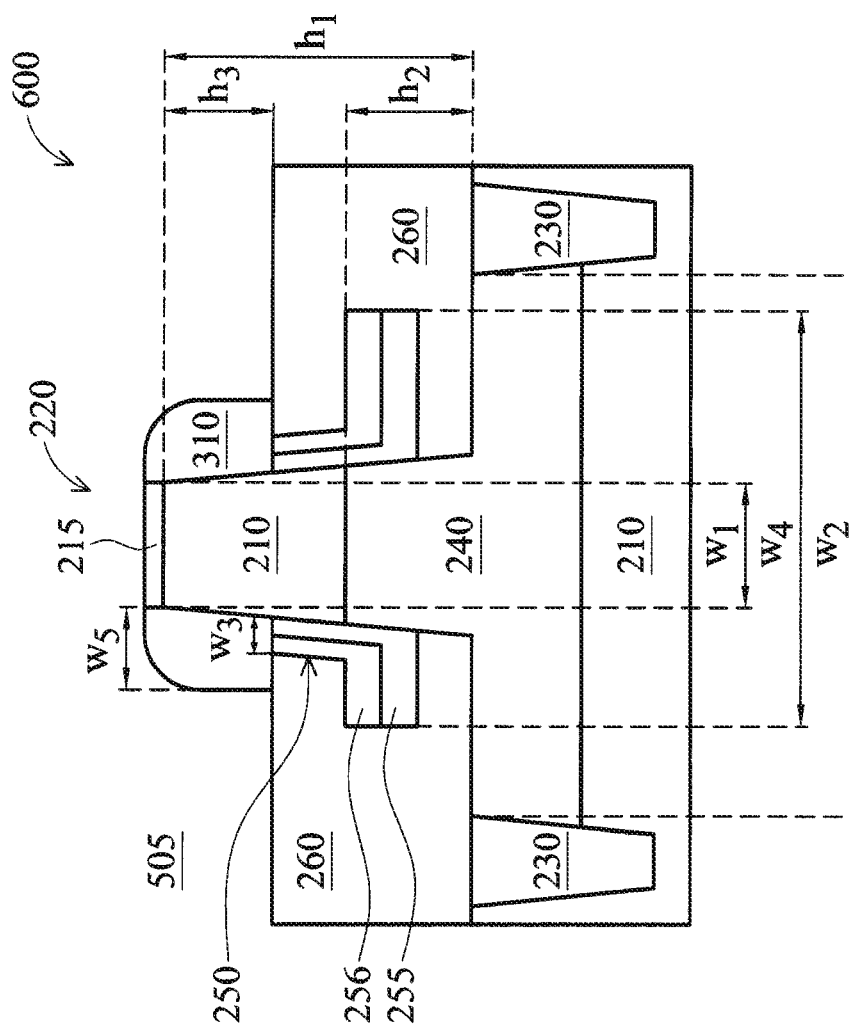
FIGS. 3, 4, and 5 are cross-sectional views of an example semiconductor device at fabrication stages constructed according to the method of FIG. 1.

Referring to FIGS. 1 and 3, once the precursor 200 is received, the method 100 proceeds to step 104 by forming a sidewall spacer 310 with a fifth width $w_5$ along sidewalls of the top portion of the core structure 220, including over the gating surface of the core structure 220 and the isolation dielectric layer 260. In one embodiment, $w_5$ is substantially larger than $w_3$. The sidewall spacer 310 may include a dielectric material such as silicon nitride. Alternatively, the sidewall spacers 310 may include silicon oxide silicon carbide, silicon oxynitride, or combinations thereof. In one embodiment, a material of the sidewall spacer 310 is selected to obtain a substantial etch selectivity with respect to the isolation dielectric layer 260 in a later contact etch, which will be described in details. The sidewall spacers 310 may be formed by deposition and etching processes. For example, after depositing, an anisotropic dry etch is performed to form the sidewall spacer 310.

Figure 4:
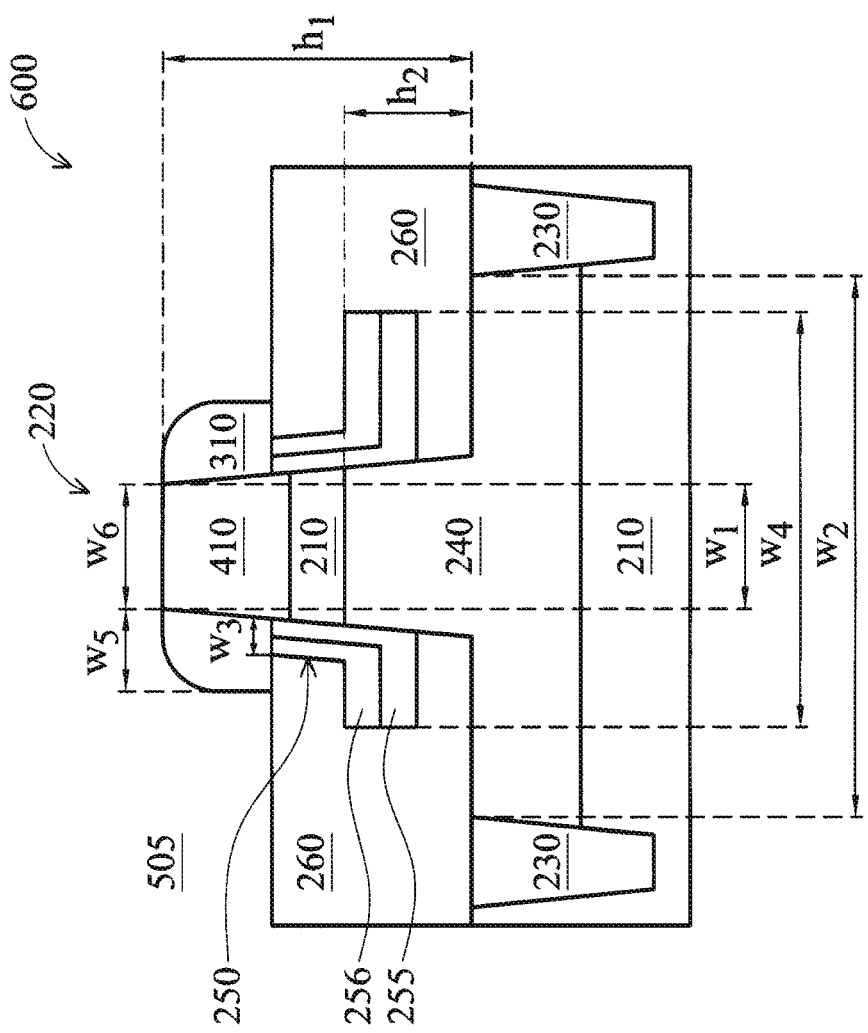

Referring to FIGS. 1 and 4, the method 100 proceeds to step 106 by forming a source region 410 with a sixth width $w_6$ on the top portion of the core structure 220, including overlapping with the gating surface of the gate stack 250. The source region 410 is formed with a different dope type than the drain region 240. In one embodiment, after removing the hard mask, the source region 410 is formed by photolithography patterning, implantation and annealing. In this case, the sixth width $w_6$ is about the same as the first width $w_1$. In another embodiment, after the hard mask 215 removal, the core structure 220 is recessed first and then the source region 410 is formed as the top portion of the recessed core structure 220 by photolithography patterning, implantation and annealing. In yet another embodiment, a semiconductor material is epitaxially grown on the recessed core structure 220. In this case, the sixth width $w_6$ may be different than the first width $w_1$. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The source region 410 may be in-situ doped during the epitaxy process. In one embodiment, the source region 410 is not in-situ doped, and an implantation process (i.e., a junction implant process) is performed to dope the source region 410.

Figure 5:
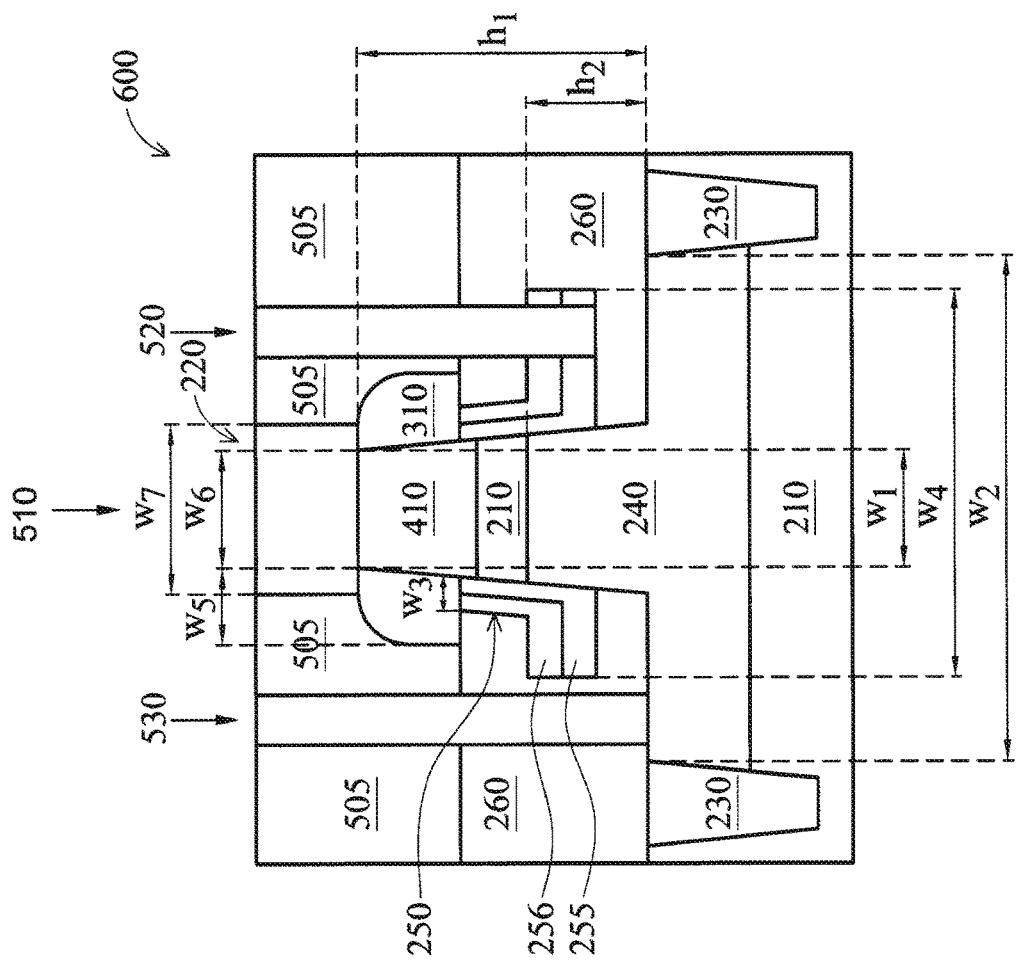

Referring to FIGS. 1 and 5, the method 100 proceeds to step 108 by forming source contact 510, gate contact 520 and drain contact 530. A dielectric layer 505 is deposited over the isolation dielectric layer 260, including over the source region 410. The dielectric layer 505 is similar in many respects to those discussed above in association with the isolation dielectric layer 260 in FIG. 2. In present embodiment, the dielectric layer 505 is selected to obtain an adequate etch selectivity with respect to the sidewall spacer 310 in a contact etch. Additionally, a CMP process is performed to planarize the top surface of the dielectric layer 505.

Contacts of 510, 520 and 530 may be formed by lithography patterning and etch processes. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. In the present embodiment, the source contact 510 is patterned to have an enlarged critical dimension (CD), referred as to a seventh width $w_7$, such that it is substantially larger than the $w_6$ the source region 410. As an example, the $w_7$ is designed to be $w_6$ plus a contact photolithography overlay limit. As another example, the $w_7$ is designed to be $w_6$ plus times of the contact photolithography overlay limit. The enlarged source contact CD may not only relax constrains of contact lithography but also may provide a misalignment-immune-like source contact.

The etching process includes a dry etch, a wet etch, or a combination thereof. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. The etching process may include a multiple-step etching to gain etch selectivity, flexibility and desired etch profile. In the present embodiment, in collaboration with selecting of materials of the isolation dielectric layer 260, the sidewall spacer 310 and the dielectric layer 505, the contact etching is configured to have an adequate selectivity with respect to the sidewall spacer 310. Thus, in the contact etch, the source contact 510 obtains a quasi-self-aligned etch nature, which may improve process capability to prevent source-gate short due to over etching. In one embodiment, the gate contact 520 is formed at the planar portion of the gate stack 250.

The TFET device 600 may undergo further CMOS or MOS technology processing to form various features and regions known in the art. For example, subsequent processing may form various vias/lines and multilayers interconnect features (e.g., metal layers and interlayer dielectrics) on the substrate 210, configured to connect the various features or structures of the TFET device 600. For example, a multi-layer interconnection includes vertical interconnects, such as conventional and horizontal interconnects, such as metal lines. The various interconnection features may implement various conductive materials including copper, tungsten, and/or silicide.

Additional steps can be provided before, during, and after the method 100, and some of the steps described can be replaced, eliminated, or moved around for additional embodiments of the method 100.

Based on the above, the present disclosure offers a vertical TFET device employing an enlarged and quasi-self-aligned source contact and methods of fabrication. The enlarged and quasi-self-aligned source contact provides a flexible contact photolithography process, a misalignment-immune-like source contact resistance and improves process window for source-gate short.

The present disclosure provides many different embodiments of TFET device that provide one or more improvements over other existing approaches. In one embodiment, the TFET device includes a precursor. The precursor includes a substrate, a frustoconical protrusion structure disposed over the substrate and protruding out of the plane of substrate, a gate stack disposed over the substrate. The gate stack has a planar portion, which is parallel to the surface of substrate and a gating surface, which wraps around a middle portion of the frustoconical protrusion structure, an isolation dielectric layer disposed between the planar portion of the gate stack and the substrate. The TFET device also includes a source region disposed as a top portion of the frustoconical protrusion structure, including overlapping with a top portion of the gating surface of the gate stack, a sidewall spacer disposed along sidewall of the source region, on top of the gating surface and connecting with the isolation dielectric layer, a dielectric layer disposed over the source region and a source contact with a critical dimension (CD), which is substantially larger than a width of the source region, formed on the source region and extending to the sidewall spacer.

In another embodiment, a vertical TFET device includes a semiconductor substrate, a frustoconical protrusion disposed over the substrate and protruding out of the plane of semiconductor substrate, a source region with a first width as a top portion of the frustoconical protrusion, a high-k/metal gate (HK/MG) disposed over the semiconductor substrate. The HK/MG has a planar portion, which is parallel to the surface of semiconductor substrate and a gating surface, which wraps around a middle portion of the frustoconical protrusion, including overlapping with the source region. The TFET device also includes a sidewall spacer disposed along the source region and over the gating surface, a drain region disposed over the semiconductor substrate adjacent to the frustoconical protrusion and extending to a bottom portion of the frustoconical protrusion as a raised drain region, an isolation dielectric layer disposed between the planar portion of the HK/MG and the drain region, over the source region and the drain region and a source contact with a second width at the source region and the sidewall spacer, wherein the second width is substantially larger than the first width.

In yet another embodiment, a method of fabricating a semiconductor device includes providing a precursor. The precursor includes a substrate, a frustoconical protrusion structure disposed over the substrate and protruding out of the plane of substrate, a drain region disposed over the substrate adjacent to the frustoconical protrusion structure and extending to a bottom portion of the frustoconical protrusion structure as a raised drain region, an isolation feature disposed between each drain regions, a gate stack disposed over the substrate, wherein the gate stack having a planar portion, which is parallel to the surface of substrate and a gating surface, which wraps around a middle portion of the frustoconical protrusion structure, including overlapping with the drain region and an isolation dielectric layer disposed between the planar portion of the gate stack and the drain region. The method also includes forming a sidewall spacer along a top portion of the frustoconical protrusion structure, over the gating surface of the frustoconical protrusion and connecting with the isolation dielectric layer, forming a source region as the top portion of the frustoconical protrusion structure, wherein the source region has a different dope type than the drain region, depositing a dielectric layer over the source region, the gate stack and the drain region and performing a selective contact etch to etch the dielectric layer and the isolation dielectric layer together to form a source contact at the source region and the sidewall spacer together, a gate contact at the planar portion of the gate stack and a drain contact at drain region. A critical dimension of the source contact is formed substantially larger that a width of the source region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, source and drain regions are often swapped with an appropriate process modification/interchanging, depending on the transistor's eventual use and electrical configuration. Therefore, the terms "source" and "drain" are deemed to be interchangeable under such circumstances. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a tunneling field-effect transistor (TFET), the method comprising:
    etching a semiconductor substrate to form a semiconductor protrusion that protrudes out from a top surface of the semiconductor substrate;
    forming a drain region in a lower portion of the semiconductor protrusion and a portion of the semiconductor substrate adjacent to the semiconductor protrusion;
    forming a gate stack that wraps around a middle portion of the semiconductor protrusion and a top portion of the lower portion of the semiconductor protrusion that includes the drain region;
    forming a first isolation material over the gate stack, such that a gating surface of the gate stack is exposed and the first isolation material wraps around a bottom portion of the lower portion of the semiconductor protrusion that includes the drain region;
    forming a sidewall spacer over the gating surface of the gate stack and the first isolation material, wherein the sidewall spacer wraps an upper portion of the semiconductor substrate;
    forming a source region in the upper portion of the semiconductor protrusion, wherein the source region extends into the middle portion of the semiconductor protrusion, such that the gate stack wraps around a portion of the source region;
    forming a second isolation material over the sidewall spacer, the first isolation material, and the source region; and
    forming a source contact over the source region, wherein the forming the source contact includes selectively etching the second isolation material relative to the sidewall spacer, and further wherein a width of the source contact is greater than a width of the source region.

2. The method of claim 1, wherein the forming the sidewall spacer includes:
    depositing a spacer layer over the first isolation material and the upper portion of the semiconductor protrusion, wherein a material of the spacer layer is different than the first isolation material; and
    etching the spacer layer to define the sidewall spacer around the upper portion of the semiconductor protrusion.

3. The method of claim 1, wherein the sidewall spacer directly contacts the first isolation material, the upper portion of the semiconductor protrusion, and the gating surface of the gate stack.

4. The method of claim 1, wherein etching a semiconductor substrate to form a semiconductor protrusion comprises using a hard mask layer to define the semiconductor protrusion, and the method further comprises:
    removing the hard mask layer prior to forming the source region.

5. The method of claim 1, wherein forming the source region comprises:
    forming a pattern over the upper portion of the semiconductor protrusion;
    implanting dopants into the upper portion of the semiconductor protrusion; and
    annealing the upper portion to activate at least some of the dopants.

6. The method of claim 1, wherein forming the source region comprises:
    epitaxially growing the upper portion of the semiconductor protrusion on the middle portion of the semiconductor protrusion.

7. The method of claim 6, wherein the epitaxially grown upper portion is formed from a different material than the middle portion of the semiconductor protrusion.

8. The method of claim 6, wherein the upper portion is doped in situ as the upper portion is epitaxially grown.

9. The method of claim 1, wherein the semiconductor protrusion has a circular cross-section.

10. The method of claim 1, wherein the semiconductor protrusion has a rectangular cross-section.

11. The method of claim 1, wherein the gate stack further includes a planar portion extending parallel to the top surface of the semiconductor substrate and extending away from the semiconductor substrate.

12. A method for forming a tunneling field-effect transistor (TFET), the method comprising:
    providing a precursor, wherein the precursor includes:
        a substrate;
        a frustoconical protrusion structure disposed over the substrate and protruding out of a top surface of the substrate;
        a drain region disposed in the substrate adjacent to the frustoconical protrusion structure and extending into a bottom portion of the frustoconical protrusion structure;
        a gate stack embedded in an isolation dielectric layer, wherein the gate stack wraps around a middle portion of the frustoconical protrusion structure, wherein the gate stack surrounds a portion of the drain region, wherein a total width of the gate stack is less than a total width of the drain region and greater than a total width of the frustoconical protrusion structure, and wherein the isolation dielectric layer is disposed between the gate stack and the drain region;

forming a sidewall spacer along a top portion of the frustoconical protrusion structure, wherein a width of the sidewall spacer is greater than a width of a gating surface of the gate stack, such that the sidewall spacer directly contacts the gate stack and the isolation dielectric layer;

forming a source region as the top portion of the frustoconical protrusion structure, wherein a dopant type of the source region is different than a dopant type of the drain region;

depositing a dielectric layer over the source region, the sidewall spacer, and the isolation dielectric layer; and performing a selective contact etch process that etches the dielectric layer and the isolation dielectric layer without substantially etching the sidewall spacer when forming a source contact to the source region, a gate contact to the gate stack, and a drain contact to the drain region.

13. The method of claim 12, wherein a material of the sidewall spacer is different than a material of the dielectric layer and the isolation dielectric layer.

14. The method of claim 13, wherein the sidewall spacer includes silicon and nitrogen and the dielectric layer and the isolation dielectric layer include silicon and oxygen.

15. The method of claim 12, wherein a critical dimension of the source contact is equal to a width of the source region plus an overlay limit.

16. The method of claim 12, wherein the forming the sidewall spacer includes:

depositing a sidewall spacer layer over the isolation dielectric layer, the gate stack, and the top portion of the frustoconical protrusion structure; and performing a selective etch process that etches the sidewall spacer layer without substantially etching the isolation dielectric layer.

17. The method of claim 12, further comprising performing a patterning process to form the gate stack, wherein the gate stack includes a high-k dielectric layer and a metal gate layer.

18. The method of claim 12, further comprising performing a patterning process to form the gate stack, wherein the gate stack includes a gate dielectric layer and a polysilicon gate layer.

19. A method for forming a tunneling field-effect transistor (TFET), the method comprising:

forming a protrusion that extends vertically from a substrate;

forming a drain region in a bottommost portion of the protrusion;

forming a gate stack that wraps a middle portion of the protrusion;

forming a source region in a topmost portion of the protrusion;

forming spacers along a portion of the topmost portion of the protrusion; and forming a drain contact coupled to the drain region, a gate contact coupled to the gate stack, and a source contact coupled to the source region, wherein the source contact has a width that is greater than a width of the source region plus a contact lithography overlay limit, such that the source contact is disposed on the source region and a portion of the spacers, and further wherein the gate stack wraps around a portion of the source region and a portion of the drain region.

20. The method of claim 19, wherein a width of the spacers is greater than a width of a gating surface of the gate stack.

* * * * *